(12) United States Patent
Hawari et al.

(10) Patent No.: US 10,944,852 B2
(45) Date of Patent: Mar. 9, 2021

(54) COMPUTER NETWORK PACKET TRANSMISSION TIMING

(71) Applicant: Cisco Technology, Inc., San Jose, CA (US)

(72) Inventors: Mohammed Hawari, Montigny-le-Bretonneux (FR); Andre Surcouf, St Leu la Foret (FR)

(73) Assignee: CISCO TECHNOLOGY, INC., San Jose, CA (US)

( * ) Notice: Subject to any disclaimer, the term of this patent is extended or adjusted under 35 U.S.C. 154(b) by 122 days.

(21) Appl. No.: 16/392,533

(22) Filed: Apr. 23, 2019

(65) Prior Publication Data
US 2020/0344333 A1 Oct. 29, 2020

(51) Int. Cl.
*H04L 29/06* (2006.01)
*H04J 3/06* (2006.01)
(Continued)

(52) U.S. Cl.
CPC .......... *H04L 69/28* (2013.01); *H03M 13/09* (2013.01); *H04J 3/065* (2013.01); *H04J 3/0644* (2013.01); *H04L 49/9078* (2013.01)

(58) Field of Classification Search
CPC ... H04L 69/28; H04L 49/9078; H04L 1/1851; H04L 1/1883; H04L 29/06993;
(Continued)

(56) References Cited

U.S. PATENT DOCUMENTS

| | | | |
|---|---|---|---|
| 2012/0082156 A1* | 4/2012 | Swartzentruber | H04L 7/0091 370/389 |
| 2012/0311168 A1* | 12/2012 | Dougan | H04L 69/28 709/230 |

(Continued)

OTHER PUBLICATIONS

Takano, et al., "High-Resolution Timer-based Packet Pacing Mechanism on the Linux Operating System", IEICE Transactions on Communications, Aug. 2011, 10 pages.

*Primary Examiner* — Andrew Lai
*Assistant Examiner* — M Mostazir Rahman
(74) *Attorney, Agent, or Firm* — Johnson, Marcou, Isaacs & Nix, LLC

(57) ABSTRACT

Establishing an expected transmit time at which a network interface controller (NIC) is expected to transmit a next packet. Enqueuing, with the NIC and before the expected transmit time, a packet $P_1$ to be transmitted at the expected transmit time. Upon enqueuing $P_1$, incrementing the expected transmit time by an expected transmit duration of $P_1$. Transmitting at the NIC's line rate and timestamping enqueued $P_1$ with its actual transmit time. Adjusting the expected transmit time by a difference between $P_1$'s actual transmit and $P_1$'s expected transmit time. Requesting, before completion of transmitting $P_1$, to transmit a $P_2$ at time $t(P_2)$. Enqueuing, in sequence, zero or more $P_0$, such that the current expected transmit time plus the duration of the transmission of the $P_0$s at the line rate equals $t(P_2)$. Transmitting at the line rate each enqueued $P_0$. Upon enqueuing each $P_0$, incrementing, for each $P_0$, the expected transmit (Continued)

time by the expected transmit duration of the $P_0$. Enqueuing $P_2$ for transmission directly following enqueuing the final $P_0$. Transmitting, by the NIC, enqueued $P_2$ at $t(P_2)$.

20 Claims, 5 Drawing Sheets

(51) Int. Cl.
*H04L 12/861* (2013.01)
*H03M 13/09* (2006.01)

(58) Field of Classification Search
CPC .... H04L 49/351; H04L 49/352; H03M 13/09; H03M 13/091; H03M 12/093; H04J 13/0644; H04J 3/065
See application file for complete search history.

(56) References Cited

U.S. PATENT DOCUMENTS

| | | | |
|---|---|---|---|
| 2014/0177653 A1* | 6/2014 | Tzeng | H04J 3/0635 370/503 |
| 2015/0295669 A1* | 10/2015 | Chapman | H04L 12/2801 370/503 |
| 2016/0098326 A1* | 4/2016 | Rebello | G06F 11/364 714/55 |
| 2017/0272693 A1* | 9/2017 | Strein | H04J 3/0667 |
| 2019/0082204 A1* | 3/2019 | Surcouf | H04N 21/234381 |
| 2019/0138047 A1* | 5/2019 | El Kolli | H04J 3/0697 |
| 2020/0028585 A1* | 1/2020 | Abdullah | H04B 10/0795 |
| 2020/0099623 A1 | 3/2020 | Hawari | |

\* cited by examiner

200

Establish, by a host, an expected transmit time at which a network interface controller (NIC) of the host is expected to transmit a next packet of type P
210

Enqueue, by the host with the NIC and prior to the expected transmit time, a packet P1 of type P to be transmitted by the NIC at the expected transmit time
215

Upon enqueuing P1, increment, by the host, the expected transmit time by an expected transmit duration of P1, and
220

Transmit at a line rate of the NIC and timestamp, by the NIC, enqueued P1 with the actual transmit time of P1
225

Adjust, by the host, the expected transmit time by a difference between the actual transmit time of P1 and the expected transmit time of P1
230

Request, by the host and prior to completion of transmitting P1, to transmit a P2 at time t(P2) later than the incremented and adjusted expected transmit time
235

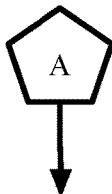

Enqueue by the host ≥ 0 packets *P0* in sequence such that the expected transmit time plus the duration of the transmission of the packets *P0* at the line rate of the NIC equals *t(P2)*
240

Transmit at the line rate of the NIC, by the NIC, each enqueued *P0*
245

Upon enqueuing each *P0*, increment, by the host, the expected transmit time by the expected transmit duration of each *P0*
250

Enqueue, by the host, packet *P2* for transmission directly following enqueuing the final *P0*
255

Transmit, by the NIC, enqueued *P2* at *t(P2)*
255

FIG. 2 - cont'd

COMPUTER NETWORK PACKET TRANSMISSION TIMING

TECHNICAL FIELD

The disclosed technology relates to computer network operation. Particular embodiments relate to controlling the timing of transmission of packets from an active node in a packet-switched network.

BACKGROUND

In computer networking, a network "node" is either data communication equipment (DCE) such as a switch or a bridge, or data terminal equipment (DTE) such as a "host" computer or a peripheral (such as a printer). In a network, nodes are connected by a transmission medium, for example wired or wireless. Both the Open Systems Interconnection (OSI) reference model and the Internet protocol suite (more commonly known as "TCP/IP" for two of the protocols in the suite) model computer networking with a hierarchy of layers of increasing abstraction—from layers closest to the transmission medium between nodes, to layers closest to any applications running on the node. Each layer supports the layers above it, and is supported by the layers below it.

A Network Interface Controller (MC) is a subsystem of a node that connects the node to a computer network by managing the layers closest to the transmission medium, for example, the physical layer and the data link layer in the OSI reference model. NICs are also known as "network interface cards"—from early implementations as expansion cards that plugged into a computer's bus. In packet switched computer networks, the protocol data unit (PDU) managed by a NIC is the "packet."

BRIEF DESCRIPTION OF THE DRAWINGS

FIG. 2 is a block flow diagram depicting methods to transmit packets from computer network nodes, in accordance with certain example embodiments.

DETAILED DESCRIPTION OF EXAMPLE EMBODIMENTS

Figure 1:
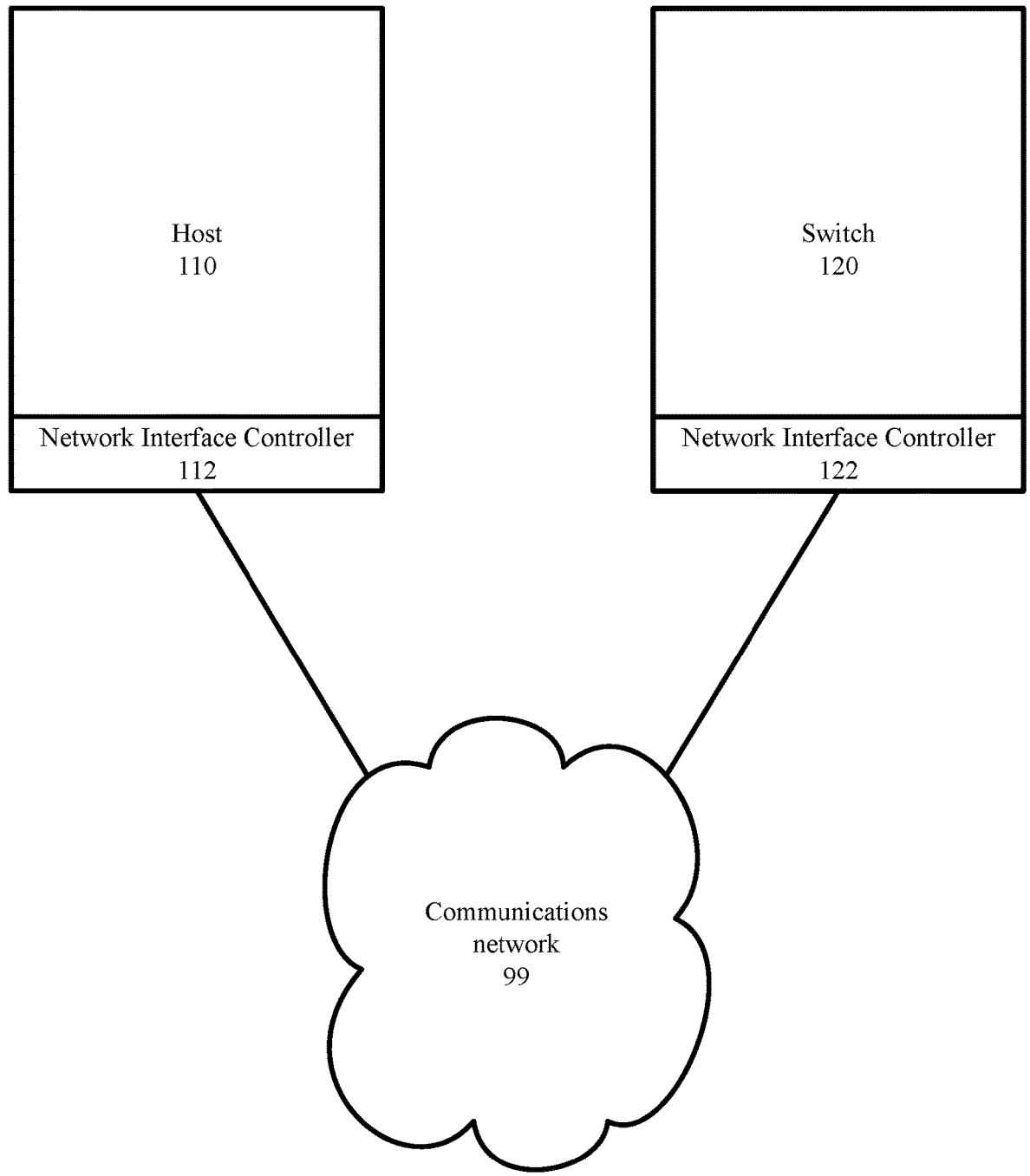
FIG. 1 is a block diagram depicting a communications and processing architecture to transmit packets from computer network nodes, in accordance with certain example embodiments.

Typical NICs are not equipped to control the transmit time of packets onto the transmission media tighter than a few milliseconds—due in part to operating system (OS) scheduling limitations and input/output bus (for example Peripheral Component Interconnect (PCI)) jitter.

Embodiments herein provide computer-implemented methods, systems, and computer program products to transmit packets from computer network hosts. In some embodiments, a computer network host establishes an expected transmit time at which a network interface controller (NIC) of the host is expected to transmit a next packet of type P. The host enqueues, with the NIC and prior to the expected transmit time, a packet $P_1$ of type P to be transmitted by the NIC at the expected transmit time. Upon enqueuing $P_1$, the host first increments the expected transmit time by an expected transmit duration of $P_1$. The NIC then transmits (at its line rate) and timestamps enqueued $P_1$ with the actual transmit time of $P_1$. The host adjusts the expected transmit time by a difference between the actual transmit time of $P_1$ and the expected transmit time of $P_1$. The host receives, prior to completion by the NIC of transmitting $P_1$, a request to transmit a packet $P_2$ of type P at a time $t(P_2)$ later than the first incremented and adjusted expected transmit time. The host then enqueues, in sequence, zero or more packets $P_0$ of type P, such that the first incremented and adjusted expected transmit time plus the duration of the transmission of the packets $P_0$ at the line rate of the NIC equals $t(P_2)$. The NIC transmits, at its line rate, each enqueued $P_0$. Upon enqueuing each $P_0$, the host second increments, for the enqueued $P_0$, the expected transmit time by the expected transmit duration of the enqueued $P_0$. The host enqueues packet $P_2$ for transmission directly following enqueuing the final $P_0$, and transmits enqueued $P_2$ at $t(P_2)$.

In some embodiment, each packet $P_0$ is a packet that will not propagate beyond the first data communication equipment (DCE) node encountered after transmission by the NIC. In some such embodiment, each packet $P_0$ comprises an Ethernet flow control pause frame specifying zero pause duration.

In some embodiments, the NIC participates in Precision Time Protocol (PTP), and the timestamping is PTP hardware timestamping. In some such embodiments, adjusting the expected transmit time ($t_{next\_P\_TX}$) further comprises scaling the adjustment based on a ratio of the frequency of the PTP master/synchronization source clock (often found at a nearby network switch) and the frequency of the NIC slave/synchronization destination clock. In some such embodiments, the ratio is determined based on an average unscaled adjustment over a moving window of W unscaled adjustments.

By using and relying on the methods and systems described herein, the technology disclosed herein provides for more control over packet transmit times than is typical. As such, the technologies described herein may be employed to support applications such as digital media production (which needs phase aligned data streams), industrial process control, and future innovation such as global scheduling of traffic in a data center to reduce queuing delays.

These and other aspects, objects, features, and advantages of the example embodiments will become apparent to those having ordinary skill in the art upon consideration of the following detailed description of illustrated example embodiments. Turning now to the drawings, in which like numerals represent like (but not necessarily identical) elements throughout the figures, example embodiments are described in detail.

Example System Architectures

In example architectures for the technology, while each server, system, and device shown in the architecture is represented by one instance of the server, system, or device, multiple instances of each can be used. Further, while certain aspects of operation of the technology are presented in examples related to the figures to facilitate enablement of the claimed invention, additional features of the technology, also facilitating enablement of the claimed invention, are disclosed elsewhere herein.

FIG. 1 is a block diagram depicting a communications and processing architecture 100 to transmit packets from computer network nodes. While each element shown in the architecture is represented by one instance of the element, multiple instances of each can be used. Further, while certain aspects of operation of the present technology are presented in examples related to FIG. 1 to facilitate enablement of the claimed invention, additional features of the present technology, also facilitating enablement of the claimed invention, are disclosed elsewhere herein.

As depicted in FIG. 1, the architecture 100 includes a host 110 (representing a DTE) and a switch 120 (representing a DCE), connected by communications network 99. Both host 110 and switch 120 include a MC 112 and 122, respectively. In some embodiments, a user associated with a device must install an application and/or make a feature selection to obtain the benefits of the technology described herein.

Network 99 includes one or more of a local area network (LAN), a wide area network (WAN), an intranet, an Internet, a storage area network (SAN), a personal area network (PAN), a metropolitan area network (MAN), a wireless local area network (WLAN), a virtual private network (VPN), a cellular or other mobile communication network, a BLUETOOTH® wireless technology connection, any combination thereof, and any other appropriate architecture or system that facilitates the communication of signals, data, and/or messages. Throughout the discussion of example embodiments, it should be understood that the terms "data" and "information" are used interchangeably herein to refer to text, images, audio, video, or any other form of information that can exist in a computer-based environment.

The network connections illustrated are examples and other approaches for establishing a communications link between the computers and devices can be used. Additionally, those having ordinary skill in the art and having the benefit of this disclosure will appreciate that the network devices illustrated in FIG. 1 may have any of several other suitable computer system configurations, and may not include all the components described above.

Figure 4:
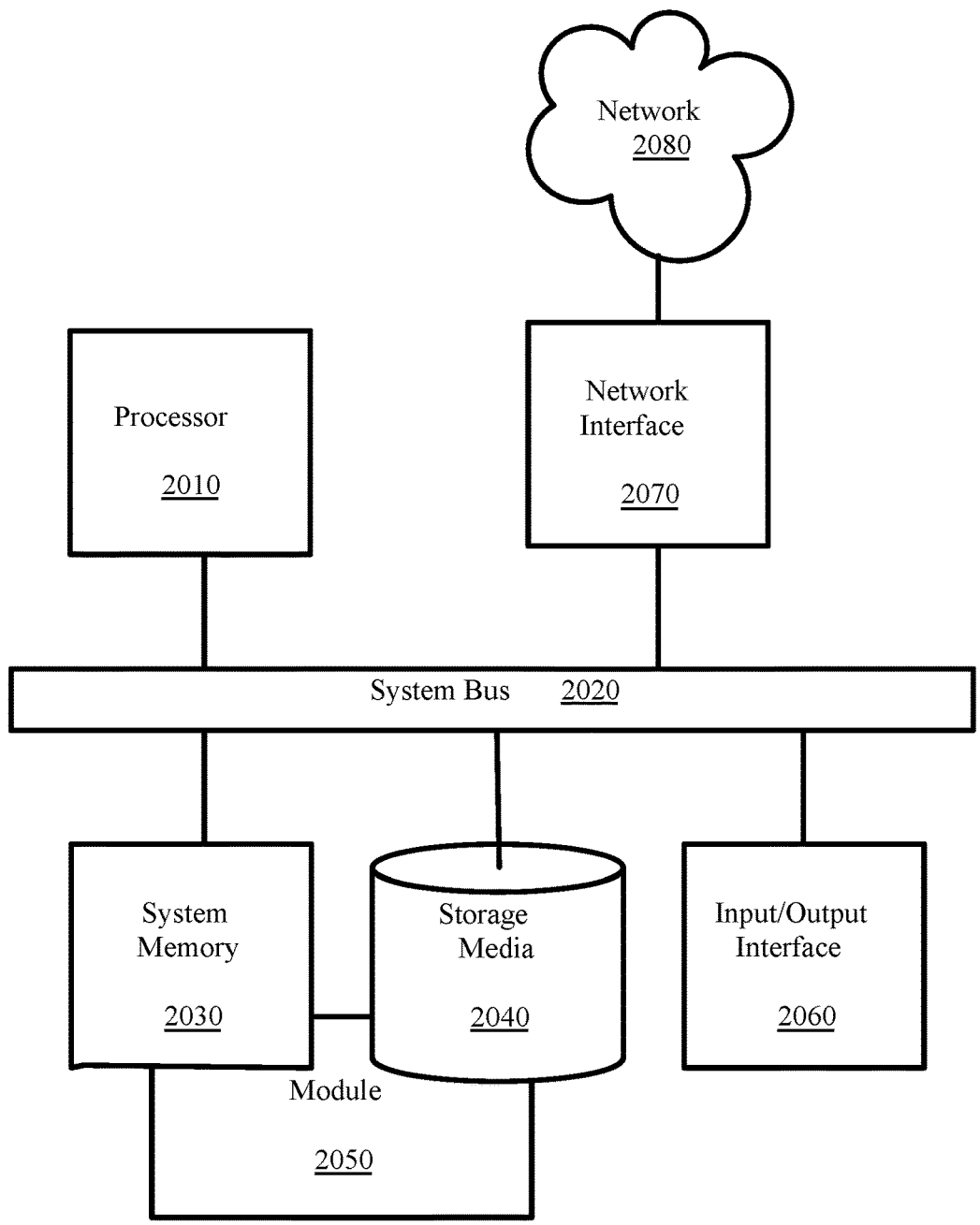
FIG. 4 is a diagram depicting a computing machine and a module, in accordance with certain example embodiments.

In example embodiments, the network computing devices, and any other computing machines associated with the technology presented herein, may be any type of computing machine such as, but not limited to, those discussed in more detail with respect to FIG. 4. Furthermore, any functions, applications, or components associated with any of these computing machines, such as those described herein or any others (for example, scripts, web content, software, firmware, hardware, or modules) associated with the technology presented herein may by any of the components discussed in more detail with respect to FIG. 4. The computing machines discussed herein may communicate with one another, as well as with other computing machines or communication systems over one or more networks, such as network 99. Each network may include various types of data or communications network, including any of the network technology discussed with respect to FIG. 4.

EXAMPLE EMBODIMENTS

The examples illustrated in the following figures are described hereinafter with respect to the components of the example operating environment and example architecture 100 described elsewhere herein. The example embodiments may also be practiced with other systems and in other environments. The operations described with respect to the example processes can be implemented as executable code stored on a computer or machine readable non-transitory tangible storage medium (e.g., floppy disk, hard disk, ROM, EEPROM, nonvolatile RAM, CD-ROM, etc.) that are completed based on execution of the code by a processor circuit implemented using one or more integrated circuits. The operations described herein also can be implemented as executable logic that is encoded in one or more non-transitory tangible media for execution (e.g., programmable logic arrays or devices, field programmable gate arrays, programmable array logic, application specific integrated circuits, etc.).

Referring to FIG. 2, and continuing to refer to FIG. 1 for context, a block flow diagram depicting methods 200 to transmit packets from computer network nodes is shown, in accordance with certain example embodiments. In such embodiments, a computer network host 110 establishes an expected transmit time ($t_{next\_P\_TX}$) at which a network interface controller (NIC) of the host is expected to transmit a next packet of type P—Block 210.

In a continuing example, the NIC 112 is part of an active DTE host 110 performing an example embodiment of the method 200 in a packet-switched computing network compatible with architecture 100, for example, a 10 Gigabit Ethernet (10 GbE) network. In some embodiments, the features of the technology can be implemented as a custom operating system (OS) driver in the host 110, or rely on kernel bypass methods to rule out the OS network stack. The initial value of time $t_{next\_P\_TX}$ can be arbitrary, but in some embodiments, a near-future time based on the host 110 clock is used.

The host enqueues, with the NIC and prior to the expected transmit time, a packet $P_1$ of type P to be transmitted by the NIC at the expected transmit time—Block 215.

In the continuing example, type P packets are 1250 bytes ($B_P$=1250 bytes) long with eight bits per byte (C=8 bits/bytes). The line rate of NIC 112 is 10 Gb (R=10×$10^9$ bits/second). In normal operation, the host 110 is enqueuing packets (for example, directing that a packet be transmitted) so that the NIC 112 will be transmitting at its line rate.

Upon enqueuing packet $P_1$ the host 110 increments the expected transmit time $t_{next\_P\_TX}$ by ($B_{P1}$*C)/R seconds (the duration it is expected to take to transmit the packet $P_1$), —Block 220. In the continuing example, the host 110 increments $t_{next\_P\_TX}$ by the time it is expected to take to transmit the given packet $P_1$ at the line rate of the NIC 112, nominally that is 1×$10^{-6}$ seconds=(1250 bytes×8 bits/byte)/(10×$10^9$ bits/second). In some embodiments, $P_1$ does not need to be actually transmitted, but only consumed from the NIC's 112 queue at rate R.

The NIC 112 transmits, at its line rate, and timestamps enqueued packet $P_1$, with the actual start of the transmission time, wherein the timestamping is characterized by a time $t_{stamp\_P1}$—Block 225. IEEE 1588 Precision Time Protocol (PTP) offers a way to synchronize the time between different nodes on an Ethernet network. The PTP standard describes a hierarchical synchronization source/synchronization destination architecture for clock distribution, in which timestamping can be implemented in the user space (software timestamping), with the Media Access Control (MAC) layer (start-of-frame detect software timestamping), and hardware timestamping directly in the physical layer. Hardware timestamping under IEEE 1588 implements timestamping functionality directly into the hardware of the Ethernet physical layer using circuitry within the Ethernet transceiver. The Ethernet transceiver inserts the time stamp into the packet as close to the transmission media as possible, which the PTP stack then extracts. The MAC has no need to insert time stamps, freeing up system resources. Hardware timestamping is used in the continuing example, with the NIC 112 clock as a slave clock. In some examples, clock synchronization protocols other than PTP can be use, as can future clock synchronization protocols. The time accuracy and precision achieved in a specific example is at least in part dependent on the accuracy and precision of clock synchronization protocol employed—with precision better than 1 nanosecond achievable. In some embodiments, the timestamp is not inserted in the packet, but in an equivalent manner, is written to a register in the NIC 112 that is made available to the host 112 for processing, including as described below.

In some embodiments, each packet $P_1$ is droppable after the initial transmission, for example, at the first link DTC switch 120 from the host 110. In the continuing example, packet $P_1$ includes an Ethernet flow control frame under Institute of Electrical and Electronics Engineers (IEEE) 802.3x standard where the first switch 120 that is encountered from the host 110 has Ethernet flow control disabled. Another option, for switches 120 with flow control enabled, is for the $P_1$ packet to include a PAUSE command with zero duration. Under such approaches, the $P_1$ packets do not affect the rest of network 100. Note that the $P_1$ packets are transmitted at the line rate of the NIC 110.

Also, after enqueuing $P_1$, but before enqueuing the next packet, the host 110 adjusts the expected transmit time $t_{next\_P\_TX}$ by a difference between the actual transmit time of $P_1$ and the expected transmit time of $P_1$—Block 230. In the continuing example, the host 110 adjusts $t_{next\_P\_TX}$ by the difference between the time that the host 110 scheduled for the transmission of $P_1$ and the actual time of transmission of $P_1$ timestamped by the NIC 112—thus bringing the expected transmit time $t_{next\_P\_TX}$ in synch with the PTP time. Consider that PTP timestamped time is an observed time, and not a directly controlling time.

The host requests (or, in the alternate, creates or receives a request), prior to completion by the NIC 112 of transmitting $P_1$, to transmit a packet $P_2$ of type P at a time $t(P_2)$ later than the first incremented and adjusted expected transmit time—Block 235. In the continuing example, an application executing on the host 110, under the host operating system, requires that a packet $P_2$ be transmitted from the MC 112 at time $t(P_2)$. As long as $t(P_2)$ is not earlier than the current expected next transmit time, which has been incremented and adjusted based on the transmission of $P_1$ and its NIC 112 timestamp, the requirement can be accommodated.

However, $t(P_2)$ may be later than the current expected transmit time. To accommodate this possible difference, and still keep the expected transmit time $t_{next\_P\_TX}$ enough in synch with the PTP time, the host 110 and NIC 112 cooperate in transmitting, at the line rate of the NIC 112 and without gaps, zero or more packets $P_0$ of type P. Specifically, the host 110 enqueues, in sequence, zero or more packets $P_0$ of type P, such that the first incremented and adjusted expected transmit time plus the expected duration of the transmission of the packets $P_0$ at the line rate of the MC equals $t(P_2)$—Block 240. The MC 112, using zero or more packets $P_0$ enqueued by the host 110, transmits each enqueued $P_0$ at the line rate of the NIC—Block 245.

Upon enqueuing each $P_0$, the host increments the expected transmit time by the expected transmit duration of each $P_0$—Block 250. In the continuing example, incrementing in this fashion, along with transmitting the $P_0$ packets at the line rate of the NIC 112, keeps the expected transmit time $t_{next\_P\_TX}$ accurate.

The host 110 enqueues packet $P_2$ for transmission directly following enqueuing the final $P_0$-Block 255. In the continuing example, this approach prepares packet $P_2$ for transmission at time $t(P_2)$ since the $P_0$ packets were selected such that their cumulative transmission time from the expected transmit time $t_{next\_P\_TX}$ adjusted after transmitting packet $P_2$ (which synchronized the host's 110 expectations with regard to NIC 112 transmit time with the actual NIC 112 transmit time) brings the expected transmit time $t_{next\_P\_TX}$ to at time $t(P_2)$. The NIC 112 then transmitting, by the MC, enqueued $P_2$ at $t(P_2)$.

More generally, the host 110 continuously enqueues $P_0$ packets and increments $t_{next\_P\_TX}$ at the rate estimating the clock in the MC 112. From time to time, the host 110 enqueues a $P_1$ packet (which is timestamped) and uses that timestamp to adjust $t_{next\_P\_TX}$. If a demand for transmission of a $P_2$ packet at time $t_2$ occur, and if $t_2$ is still in the future compared to $t_{next\_P\_TX}$, the host 110 accepts the demand for transmission of the $P_2$ packet, enqueues and transmits an amount of $P_0$ packets until it is time to enqueue the $P_2$ packet, and then transmits the $P_2$ packet at time $t_2$.

Figure 3:
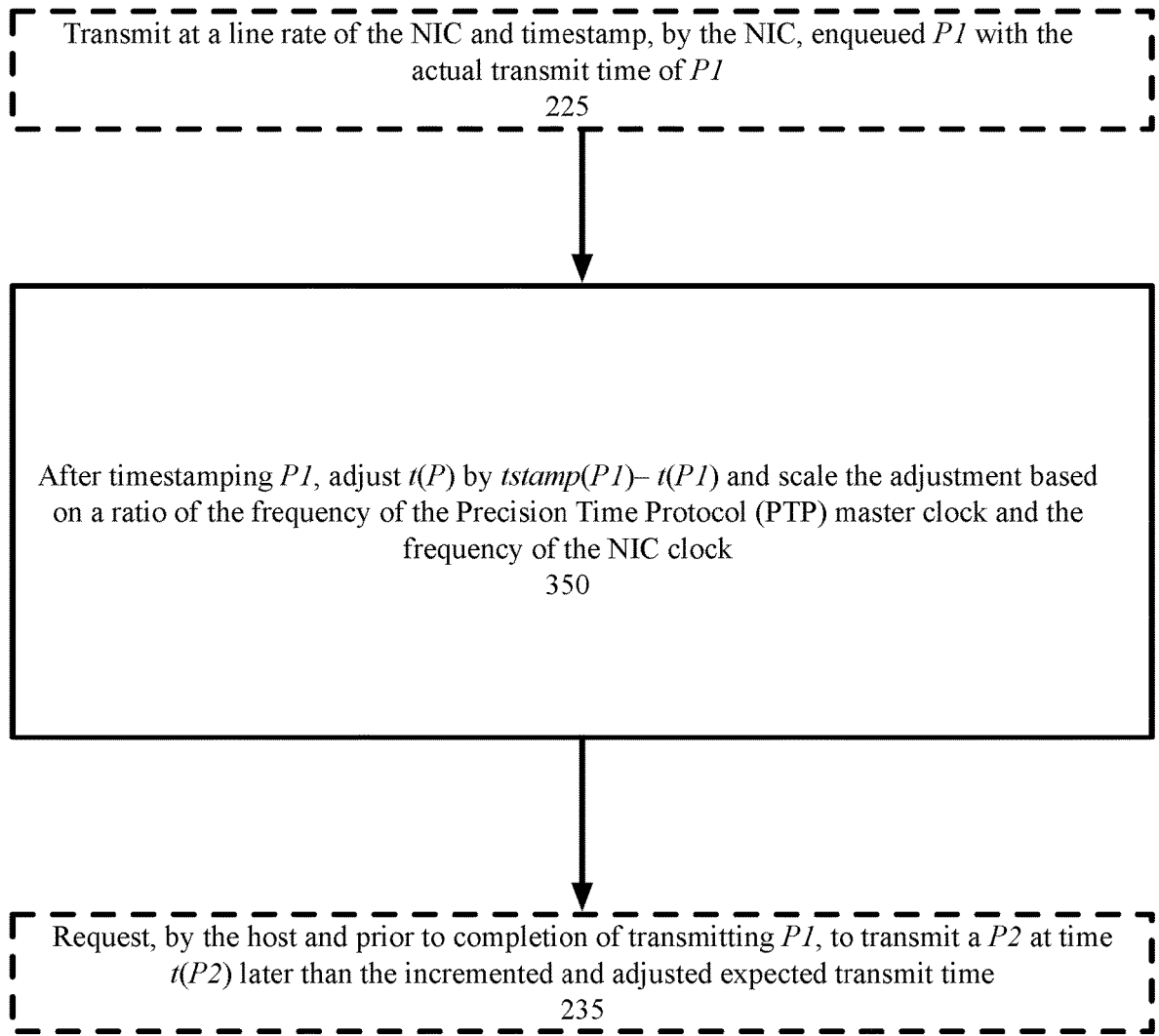
FIG. 3 is a block flow diagram depicting methods to transmit packets from computer network nodes, in accordance with certain example embodiments.

For example, in some examples, the transmission of a sequence of $P_0$ packets and a $P_1$ packets can happen in whatever order because they achieve different roles. In some examples described herein, $P_0$ packets keep the NIC 112 transmitting at a known rate so that $t_{next\_P\_Tx}$ evolves at the same rate as the time at which the next enqueued packet will be sent by the NIC. In such examples, $P_1$ packets serve to adjust $t_{next\_P\_TX}$ so that, not only is it incremented correctly, but also the value is correct with regards to the hardware timestamping of the NIC 112. In some examples a typical sequence of enqueued packets proceeds: $P_0$, $P_0$, $P_0$, $P_1$, $P_0$, ... $P_0$, $P_1$, $P_0$, ... $P_2$, $P_0$, $P_0$, ... $P_1$. Where the NIC 112 can timestamp at a higher duty cycle than is currently typical, the use of $P_0$ packets can be eliminated Referring to FIG. 3, and continuing to refer to prior figures for context, a block flow diagram 300 depicting methods to transmit packets from computer network nodes is shown, in accordance with certain example embodiments, in accordance with certain example embodiments. In such methods 300, adjusting $t_{next\_P\_TX}$ further comprises scaling the adjustment based on a ratio of the frequency f of the PTP synchronization source clock and the frequency f' of the NIC synchronization destination clock—Block 350. In a variation on the continuing example, where the is a persistent frequency mismatch between the synchronization source clock and the synchronization destination clock in the NIC 112, $t_{next\_P\_TX}$ will need to be adjusted every time the MC 112 synchs with the master/synchronization source clock (often running on a nearby network switch 120). Absent other factors, such adjustment will be roughly equal to the drift between the synchronization source clock and the NIC 112 synchronization destination clock, that is the adjustment will be roughly $((f-f') \times (period\ of\ P_0\ packets)/f'$. By measuring a moving average over the last W adjustments, the system can estimate f/f', the ratio of the synchronization source clock frequency to the MC 112 synchronization destination clock frequency. In the variation of the continuing example, the host 110 scales the adjustment of $t_{next\_P\_TX}$ by a factor equal to the average f/f' over the last W adjustments.

In some embodiments, the host 110 participates in a time synchronization protocol, such as PTP, that involves receiving synchronization packet. In such embodiments, the host can adjust $t_{next\_P\_TX}$ upon reception of the time synchronization packets using the information contained therein.

OTHER EXAMPLE EMBODIMENTS

FIG. 4 depicts a computing machine 2000 and a module 2050 in accordance with certain example embodiments. The computing machine 2000 may correspond to any of the various computers, servers, mobile devices, embedded systems, or computing systems presented herein. The module 2050 may comprise one or more hardware or software elements configured to facilitate the computing machine 2000 in performing the various methods and processing functions presented herein. The computing machine 2000 may include various internal or attached components, for example, a processor 2010, system bus 2020, system memory 2030, storage media 2040, input/output interface 2060, and a network interface 2070 for communicating with a network 2080.

The computing machine 2000 may be implemented as a conventional computer system, an embedded controller, a laptop, a server, a mobile device, a smartphone, a set-top box, a kiosk, a vehicular information system, one more processors associated with a television, a customized machine, any other hardware platform, or any combination or multiplicity thereof. The computing machine 2000 may be a distributed system configured to function using multiple computing machines interconnected via a data network or bus system.

The processor 2010 may be configured to execute code or instructions to perform the operations and functionality described herein, manage request flow and address mappings, and to perform calculations and generate commands. The processor 2010 may be configured to monitor and control the operation of the components in the computing machine 2000. The processor 2010 may be a general purpose processor, a processor core, a multiprocessor, a reconfigurable processor, a microcontroller, a digital signal processor (DSP), an application specific integrated circuit (ASIC), a graphics processing unit (GPU), a field programmable gate array (FPGA), a programmable logic device (PLD), a controller, a state machine, gated logic, discrete hardware components, any other processing unit, or any combination or multiplicity thereof. The processor 2010 may be a single processing unit, multiple processing units, a single processing core, multiple processing cores, special purpose processing cores, co-processors, or any combination thereof. According to certain embodiments, the processor 2010 along with other components of the computing machine 2000 may be a virtualized computing machine executing within one or more other computing machines.

The system memory 2030 may include non-volatile memories, for example, read-only memory (ROM), programmable read-only memory (PROM), erasable programmable read-only memory (EPROM), flash memory, or any other device capable of storing program instructions or data with or without applied power. The system memory 2030 may also include volatile memories, for example, random access memory (RAM), static random access memory (SRAM), dynamic random access memory (DRAM), and synchronous dynamic random access memory (SDRAM). Other types of RAM also may be used to implement the system memory 2030. The system memory 2030 may be implemented using a single memory module or multiple memory modules. While the system memory 2030 is depicted as being part of the computing machine 2000, one skilled in the art will recognize that the system memory 2030 may be separate from the computing machine 2000 without departing from the scope of the subject technology. It should also be appreciated that the system memory 2030 may include, or operate in conjunction with, a non-volatile storage device, for example, the storage media 2040.

The storage media 2040 may include a hard disk, a floppy disk, a compact disc read only memory (CD-ROM), a digital versatile disc (DVD), a Blu-ray disc, a magnetic tape, a flash memory, other non-volatile memory device, a solid state drive (SSD), any magnetic storage device, any optical storage device, any electrical storage device, any semiconductor storage device, any physical-based storage device, any other data storage device, or any combination or multiplicity thereof. The storage media 2040 may store one or more operating systems, application programs and program modules, for example, module 2050, data, or any other information. The storage media 2040 may be part of, or connected to, the computing machine 2000. The storage media 2040 may also be part of one or more other computing machines that are in communication with the computing machine 2000, for example, servers, database servers, cloud storage, network attached storage, and so forth.

The module 2050 may comprise one or more hardware or software elements configured to facilitate the computing machine 2000 with performing the various methods and processing functions presented herein. The module 2050 may include one or more sequences of instructions stored as software or firmware in association with the system memory 2030, the storage media 2040, or both. The storage media 2040 may therefore represent examples of machine or computer readable media on which instructions or code may be stored for execution by the processor 2010. Machine or computer readable media may generally refer to any medium or media used to provide instructions to the processor 2010. Such machine or computer readable media associated with the module 2050 may comprise a computer software product. It should be appreciated that a computer software product comprising the module 2050 may also be associated with one or more processes or methods for delivering the module 2050 to the computing machine 2000 via the network 2080, any signal-bearing medium, or any other communication or delivery technology. The module 2050 may also comprise hardware circuits or information for configuring hardware circuits, for example, microcode or configuration information for an FPGA or other PLD.

The input/output (I/O) interface 2060 may be configured to couple to one or more external devices, to receive data from the one or more external devices, and to send data to the one or more external devices. Such external devices along with the various internal devices may also be known as peripheral devices. The I/O interface 2060 may include both electrical and physical connections for operably coupling the various peripheral devices to the computing machine 2000 or the processor 2010. The I/O interface 2060 may be configured to communicate data, addresses, and control signals between the peripheral devices, the computing machine 2000, or the processor 2010. The I/O interface 2060 may be configured to implement any standard interface, for example, small computer system interface (SCSI), serial-attached SCSI (SAS), fiber channel, peripheral component interconnect (PCI), PCI express (PCIe), serial bus, parallel bus, advanced technology attached (ATA), serial ATA (SATA), universal serial bus (USB), Thunderbolt, FireWire, various video buses, and the like. The I/O interface 2060 may be configured to implement only one interface or bus technology. Alternatively, the I/O interface 2060 may be configured to implement multiple interfaces or bus technologies. The I/O interface 2060 may be configured as part of, all of, or to operate in conjunction with, the system bus 2020. The I/O interface 2060 may include one or more buffers for buffering transmissions between one or more external devices, internal devices, the computing machine 2000, or the processor 2010.

The I/O interface 2060 may couple the computing machine 2000 to various input devices including mice, touch-screens, scanners, electronic digitizers, sensors, receivers, touchpads, trackballs, cameras, microphones, keyboards, any other pointing devices, or any combinations thereof. The I/O interface 2060 may couple the computing machine 2000 to various output devices including video displays, speakers, printers, projectors, tactile feedback devices, automation control, robotic components, actuators, motors, fans, solenoids, valves, pumps, transmitters, signal emitters, lights, and so forth.

The computing machine 2000 may operate in a networked environment using logical connections through the network interface 2070 to one or more other systems or computing machines across the network 2080. The network 2080 may include wide area networks (WAN), local area networks (LAN), intranets, the Internet, wireless access networks, wired networks, mobile networks, telephone networks, optical networks, or combinations thereof. The network 2080 may be packet switched, circuit switched, of any topology, and may use any communication protocol. Communication links within the network 2080 may involve various digital or analog communication media, for example, fiber optic cables, free-space optics, waveguides, electrical conductors, wireless links, antennas, radio-frequency communications, and so forth.

The processor 2010 may be connected to the other elements of the computing machine 2000 or the various peripherals discussed herein through the system bus 2020. It should be appreciated that the system bus 2020 may be within the processor 2010, outside the processor 2010, or both. According to certain example embodiments, any of the processor 2010, the other elements of the computing machine 2000, or the various peripherals discussed herein may be integrated into a single device, for example, a system on chip (SOC), system on package (SOP), or ASIC device.

Embodiments may comprise a computer program that embodies the functions described and illustrated herein, wherein the computer program is implemented in a computer system that comprises instructions stored in a machine-readable medium and a processor that executes the instructions. However, it should be apparent that there could be many different ways of implementing embodiments in computer programming, and the embodiments should not be construed as limited to any one set of computer program instructions. Further, a skilled programmer would be able to write such a computer program to implement an embodiment of the disclosed embodiments based on the appended flow charts and associated description in the application text. Therefore, disclosure of a particular set of program code instructions is not considered necessary for an adequate understanding of how to make and use embodiments. Further, those skilled in the art will appreciate that one or more aspects of embodiments described herein may be performed by hardware, software, or a combination thereof, as may be embodied in one or more computing systems. Additionally, any reference to an act being performed by a computer should not be construed as being performed by a single computer as more than one computer may perform the act.

The example embodiments described herein can be used with computer hardware and software that perform the methods and processing functions described previously. The systems, methods, and procedures described herein can be embodied in a programmable computer, computer-executable software, or digital circuitry. The software can be stored on computer-readable media. For example, computer-readable media can include a floppy disk, RAM, ROM, hard disk, removable media, flash memory, memory stick, optical media, magneto-optical media, CD-ROM, etc. Digital circuitry can include integrated circuits, gate arrays, building block logic, field programmable gate arrays (FPGA), etc.

The example systems, methods, and acts described in the embodiments presented previously are illustrative, and, in alternative embodiments, certain acts can be performed in a different order, in parallel with one another, omitted entirely, and/or combined between different example embodiments, and/or certain additional acts can be performed, without departing from the scope and spirit of various embodiments. Accordingly, such alternative embodiments are included in the scope of the following claims, which are to be accorded the broadest interpretation so as to encompass such alternate embodiments.

Although specific embodiments have been described above in detail, the description is merely for purposes of illustration. It should be appreciated, therefore, that many aspects described above are not intended as required or essential elements unless explicitly stated otherwise.

Modifications of, and equivalent components or acts corresponding to, the disclosed aspects of the example embodiments, in addition to those described above, can be made by a person of ordinary skill in the art, having the benefit of the present disclosure, without departing from the spirit and scope of embodiments defined in the following claims, the scope of which is to be accorded the broadest interpretation so as to encompass such modifications and equivalent structures.

We claim:

1. A method, comprising:
    establishing, by a computer network host, an expected transmit time at which a network interface controller (NIC) of the computer network host is expected to transmit a next packet of type P;
    enqueuing, by the computer network host with the NIC and prior to the expected transmit time, a packet $P_1$ of type P to be transmitted by the NIC at the expected transmit time;
    upon enqueuing $P_1$, first incrementing, by the computer network host, the expected transmit time by an expected transmit duration of $P_1$;
    transmitting at a line rate of the NIC and timestamping, by the NIC, enqueued $P_1$ with an actual transmit time of $P_1$;
    adjusting, by the computer network host, the expected transmit time by a difference between the actual transmit time of $P_1$ and the expected transmit time of $P_1$;
    requesting, by the computer network host and prior to completion by the NIC of transmitting $P_1$, to transmit a packet $P_2$ of type P at a time $t(P_2)$ later than the first incremented and adjusted expected transmit time;
    enqueuing, by the computer network host in sequence, one or more packets $P_0$ of type P, such that the first incremented and adjusted expected transmit time plus an expected transmit duration of the transmission of the enqueued packets $P_0$ at the line rate of the NIC equals $t(P_2)$;
    enqueuing, by the computer network host, packet $P_2$ for transmission directly following a final packet $P_0$ of the enqueued one or more packets $P_0$;
    transmitting at the line rate of the NIC, by the NIC, each of the enqueued one or more packets $P_0$; and
    transmitting, by the NIC, enqueued $P_2$ at $t(P_2)$.

2. The method of claim 1, further comprising, upon enqueuing each $P_0$, second incrementing, by the computer network host for the enqueued $P_0$, the expected transmit time by the expected transmit duration of the enqueued one or more packets $P_0$.

3. The method of claim 1, wherein each packet $P_0$ is a packet that is droppable after transmission by the NIC.

4. The method of claim 3, wherein each packet $P_0$ comprises one of an Ethernet flow control frame and a bad cyclic redundancy check (CRC) frame.

5. The method of claim 1, wherein the NIC participates in Precision Time Protocol (PTP) as a synchronization destination, and wherein the timestamping is PTP hardware timestamping based on a PTP synchronization source clock operated by a network switch on the same network as the computer network host.

6. The method of claim 5, wherein adjusting the expected transmit time further comprises scaling the adjustment based on a ratio of a frequency of the PTP synchronization source clock and a frequency of a NIC synchronization destination clock.

7. The method of claim 6, wherein the ratio is determined based on an average unscaled adjustment over a moving window of W unscaled adjustments.

8. A computer program product, comprising:
a non-transitory computer-readable storage device having computer-executable program instructions embodied thereon that when executed by a computer cause the computer to transmit packets from computer network hosts, the computer-executable program instructions comprising computer-executable instructions to:
establish, by a computer network host, an expected transmit time at which a network interface controller (NIC) of the computer network host is expected to transmit a next packet of type P;
enqueue, by the computer network host with the NIC and prior to the expected transmit time, a packet $P_1$ of type P to be transmitted by the NIC at the expected transmit time;
upon enqueuing $P_1$, first increment, by the computer network host, the expected transmit time by an expected transmit duration of $P_1$;
transmit at a line rate of the NIC and timestamp, by the NIC, enqueued $P_1$ with an actual transmit time of $P_1$;
adjust, by the computer network host, the expected transmit time by a difference between the actual transmit time of $P_1$ and the expected transmit time of $P_1$;
request, by the computer network host and prior to completion by the NIC of transmitting $P_1$, to transmit a packet $P_2$ of type P at a time $t(P_2)$ later than the first incremented and adjusted expected transmit time;
enqueue, by the computer network host in sequence, one or more packets $P_0$ of type P, such that the first incremented and adjusted expected transmit time plus duration of the enqueued packets $P_0$ at the line rate of the NIC equals $t(P_2)$;
enqueue, by the computer network host, packet $P_2$ for transmission directly following a final packet $P_0$ of the enqueued one or more packets $P_0$;
transmit at the line rate of the NIC, by the NIC, each of the enqueued one or more packets $P_0$; and
transmit, by the NIC, enqueued $P_2$ at $t(P_2)$.

9. The computer program product of claim 8, further comprising, upon enqueuing each $P_0$, second incrementing, by the computer network host for the enqueued $P_0$, the expected transmit time by the expected transmit duration of the enqueued one or more packets $P_0$.

10. The computer program product of claim 8, wherein each packet $P_0$ is a packet that is droppable after transmission by the NIC.

11. The computer program product of claim 10, wherein each packet $P_0$ comprises one of an Ethernet flow control frame and a bad cyclic redundancy check (CRC) frame.

12. The computer program product of claim 8, wherein the NIC participates in Precision Time Protocol (PTP) as a synchronization destination, and wherein the timestamp is a PTP hardware timestamp based on a PTP synchronization source clock operated by a network switch on the same network as the computer network host.

13. The computer program product of claim 12, wherein adjusting the expected transmit time further comprises scaling the adjustment based on a ratio of a frequency of the PTP synchronization source clock and a frequency of a NIC synchronization destination clock.

14. The computer program product of claim 13, wherein the ratio is determined based on an average unscaled adjustment over a moving window of W unscaled adjustments.

15. A system to transmit packets from computer network hosts, comprising:
a storage device; and
a processor communicatively coupled to the storage device, wherein the processor executes application code instructions that are stored in the storage device to cause the system to:
establish, by a computer network host, an expected transmit time at which a network interface controller (NIC) of the computer network host is expected to transmit a next packet of type P;
enqueue, by the computer network host with the NIC and prior to the expected transmit time, a packet $P_1$ of type P to be transmitted by the NIC at the expected transmit time;
upon enqueuing $P_1$, first increment, by the computer network host, the expected transmit time by an expected transmit duration of $P_1$;
transmit at a line rate of the NIC and timestamp, by the NIC, enqueued $P_1$ with an actual transmit time of $P_1$;
adjust, by the computer network host, the expected transmit time by a difference between the actual transmit time of $P_1$ and the expected transmit time of $P_1$;
request, by the computer network host and prior to completion by the NIC of transmitting $P_1$, to transmit a packet $P_2$ of type P at a time $t(P_2)$ later than the first incremented and adjusted expected transmit time;
enqueue, by the computer network host in sequence, one or more packets $P_0$ of type P, such that the first incremented and adjusted expected transmit time plus an expected transmit duration of the enqueued packets $P_0$ at the line rate of the NIC equals $t(P_2)$;
enqueue, by the computer network host, packet $P_2$ for transmission directly following a final packet $P_0$ of the enqueued one or more packets $P_0$;
transmit at the line rate of the NIC, by the NIC, each of the enqueued one or more packets $P_0$; and
transmit, by the NIC, enqueued $P_2$ at $t(P_2)$.

16. The system of claim 15, further comprising, upon enqueuing each $P_0$, second incrementing, by the computer network host for the enqueued $P_0$, the expected transmit time by the expected transmit duration of the enqueued one or more packets $P_0$.

17. The system of claim 15, wherein each packet $P_0$ is a packet that is droppable after transmission by the NIC.

18. The system of claim 17, wherein each packet $P_0$ comprises one of an Ethernet flow control frame and a bad cyclic redundancy check (CRC) frame.

19. The system of claim 15, wherein the NIC participates in Precision Time Protocol (PTP) as a synchronization destination, and wherein the timestamp is a PTP hardware timestamp based on a PTP synchronization source clock operated by a network switch on the same network as the computer network host.

20. The system of claim 19, wherein adjusting the expected transmit time further comprises scaling the adjustment based on a ratio of a frequency of the PTP synchronization source clock and a frequency of a NIC synchronization destination clock.

* * * * *